United States Patent [19]
Sogard et al.

[11] Patent Number: 5,870,197
[45] Date of Patent: Feb. 9, 1999

[54] PRECISION STAGE INTERFEROMETER SYSTEM WITH LOCAL SINGLE AIR DUCT

[75] Inventors: Michael R. Sogard, Menlo Park; John K. Eaton, Stanford, both of Calif.; Kyoichi Suwa; Naoyuki Kobayashi, both of Tokyo, Japan

[73] Assignee: Nikon Corporation, Japan

[21] Appl. No.: 738,962

[22] Filed: Oct. 24, 1996

[51] Int. Cl.[6] ................................................ G01B 9/02
[52] U.S. Cl. ................................... 356/358; 355/30
[58] Field of Search ............................... 356/349, 358, 356/363, 361; 355/30

[56] References Cited

U.S. PATENT DOCUMENTS

| | | | |
|---|---|---|---|
| 4,786,947 | 11/1988 | Kosugi et al. | 355/30 |
| 4,814,625 | 3/1989 | Yabu | 250/548 |
| 4,998,821 | 3/1991 | Ohta et al. | 353/122 |
| 5,141,318 | 8/1992 | Miyazaki et al. | 356/358 |
| 5,164,789 | 11/1992 | Yoshitake et al. | 356/349 |
| 5,177,566 | 1/1993 | Leuchs et al. | 356/358 |
| 5,404,222 | 4/1995 | Lis | 356/349 |
| 5,469,260 | 11/1995 | Takagi et al. | 356/358 |

FOREIGN PATENT DOCUMENTS

| | | |
|---|---|---|
| 64-18002 | 1/1989 | Japan . |
| 1-274001 | 11/1989 | Japan . |
| 5-283313 | 10/1993 | Japan . |

*Primary Examiner*—Samuel A. Turner
*Attorney, Agent, or Firm*—Skjerven, Morrill, MacPherson, Franklin & Friel LLP; Norman R. Klivans

[57] ABSTRACT

A local air duct directs a temperature-controlled stream of air across two perpendicular sets of interferometer beams which are used to measure the two dimension (X-Y) position of a precision stage in e.g. an optical lithography stepper or step and scan system, or in any other precision coordinate measuring machine. By thereby providing an additional single air flow which is azimuthally directed across both the X and Y direction interferometer beams, the precision of the interferometric measurement is maximized. In addition, a second flow of air is directed downwards from the local air duct, thus providing sufficient air circulation onto the stage when the stage is directly beneath the local duct, even though in that location the stage is otherwise blocked from receiving the main air flow through the chamber.

33 Claims, 9 Drawing Sheets

PRECISION STAGE INTERFEROMETER SYSTEM WITH LOCAL SINGLE AIR DUCT

BACKGROUND OF THE INVENTION

1. Field of the Invention

This invention relates to environmental controls in a system which includes an interferometer and more specifically to improved air circulation onto a precision stage or other movable object whose location is determined interferometrically.

2. Description of the Prior Art

Interferometers are well known for precise measurement of object location. One use of interferometers is in an optical lithography stepper or step and scan system which includes a precision motion XY stage (or stages) moving in two dimensions on a base. It is desirable to determine both the exact location of the stage in two dimensions, as well as (sometimes) the exact location of the optical projection lens which is located so as to focus an optical image onto the stage. These systems typically use two perpendicular sets of interferometer beams to measure the horizontal two dimensional position of the precision motion XY stage. With two interferometers on each axis, any rotation of the stage about a vertical axis (yawing) can be determined, as well as deviations of the stage's plane mirrors from planarity. The stage and interferometer system are enclosed in an environmental chamber containing a flow of highly filtered and temperature controlled air, to prevent particulates from settling on the semiconductor wafer or the reticle. The environmental chamber thus assists in maintaining the index of refraction of the air at a constant value by maintaining the air temperature constant. This helps to more accurately measure the stage position, since the interferometer measures the optical path length, which is the integral of the index of refraction of the air along the interferometer path length.

It is well known that if the air varies in temperature and therefore density and refractive index, any turbulence present mixes up these different contributions, leading to rapid changes in the interferometer optical path length and hence preventing precision measurement. Sources of temperature variation are heat sources within the environmental chamber, such as electronics, motors, and sensors, as well as the illumination used to expose the wafers.

One prior art approach to deal with this problem provides a flow of air from one end of the chamber to the other, with the air temperature maintained by conventional thermostatic control. The air is passed through a HEPA filter to eliminate particulates and is intended to provide a laminar air flow across the stage for particle control and temperature control. However this has been found to be inadequate for truly precision measurement due to the above-described problems of temperature instability and turbulence in the air flow.

Therefore it is desirable to improve the air circulation paths and also to better maintain the air at a constant temperature along both sets of interferometer beams.

In the prior art it is known to use two separate air ducts to provide temperature controlled air streams across each of the two perpendicular sets of interferometer beams (e.g. see Japanese Patent document No. 7-117371). It is also known alternatively to enclose the entire stage and interferometer beams in a local chamber (inside the main chamber) which provides a temperature controlled air stream over all interferometer beams (e.g. see U.S. Pat. No. 4,998,821). Disadvantageously, the separate air ducts fail to provide air flow across the entire interferometer path length because of physical interference from the projection lens, in the case of a photolithography machine. In addition, mixing of the air flow from the separate ducts and the large scale air flow across the chamber (still needed for particulate control) can reduce the separate ducts' performance. Also the air flows from the two separate ducts may interfere with one another. Moreover the (inner) local chamber occupies considerable space and hampers access to the stage and the interferometer system, thereby inhibiting maintenance.

SUMMARY

In accordance with the present invention, in addition to the conventional cross-flow of air in an environmental chamber, a second uniform temperature air flow is provided across both the x-axis and y-axis interferometer beams. The flow of air is maintained over the wafer even when the main chamber airflow is largely blocked. Moreover, the second air flow direction is such as to ensure that it traverses all the interferometer beams.

This second air flow is provided from a local air duct which is in addition to the main air flow through the chamber. The local air duct is typically located towards a corner of the chamber and provides a uniform secondary air flow directed radially outward along approximately a quarter circle, so as to cross at approximately right angles both sets of perpendicular interferometer beams. The chief purpose of this local air duct is to provide a uniform temperature air flow over the two perpendicular sets of interferometer beams, and thereby to prevent degradation of performance of the metrology of the lithographic system. A secondary purpose is to ensure a flow of air over the wafer on the stage at any stage position within the chamber. The local air duct is typically mounted "upstream" of the wafer stage, relative to the main chamber air flow, to minimize mixing between the two air flows.

Advantageously, the flow of temperature-stabilized air across the interferometer beam paths reduces interferometer fluctuations caused by air temperature fluctuations. In addition, a tertiary air flow system is provided from the local air duct, so that a third air stream flows directly downwards from a lower surface of the local air duct. Thus when the stage is located underneath the local air duct (the local air duct being fixed inside the chamber), the wafer and other elements on the stage are maintained free of particles by this impinging third air flow. (It is to be understood that in one embodiment the third air flow is provided at all times, even when the stage has moved to another location in the chamber.) This third air flow is advantageous because normally the chamber main air flow serves this function, but the clearance between the stage and the bottom of the local air duct is such in some embodiments that an adequate flow of air over the stage would not be provided in this particular stage position.

In accordance with the present invention there is an approximately laminar flow of temperature controlled air into all regions within the chamber traversed by the interferometer beams, due to a specially designed nozzle configuration of the local air duct. The third air supply provides a downflow of air over the wafer when the stage happens to be underneath the local air duct. This third flow of air in one embodiment is from a plenum inside the local air duct, and provides a downflow of air through a set of radially located exit holes which are graded from smallest near the air source to largest at the outer edge of the local air duct, so as to obtain approximately uniform air downflow onto the upper surface of the stage.

Combining the above features in a single unit simplifies installation and removal of the local duct system, thereby simplifying maintenance.

Also, in one embodiment located inside the local air duct there is a heat exchanger which is e.g. a body of porous metal with good thermal conductivity, a large thermal mass (mass×specific heat), large air-to-metal heat transfer conductance, and a large metal surface area. This is used to better maintain air temperature uniformity and stability. Also, in one embodiment a second HEPA filter is installed inside the local duct to filter the air exiting therefrom and to equalize pressure across the local duct nozzle inlet.

In one embodiment a fourth air flow is directed from a wall of the chamber perpendicular to the main chamber air flow, from a location behind the local air duct.

Also in accordance with the invention, a shield is located between the source of the main air flow through the chamber and the interferometer mount which is in the path of this main air flow. This shield helps prevent mixing of the two air flows along the interferometer beam paths.

BRIEF DESCRIPTION OF THE DRAWINGS

Identical reference numerals in various figures refer to identical or similar structures.

DETAILED DESCRIPTION

Figure 1:
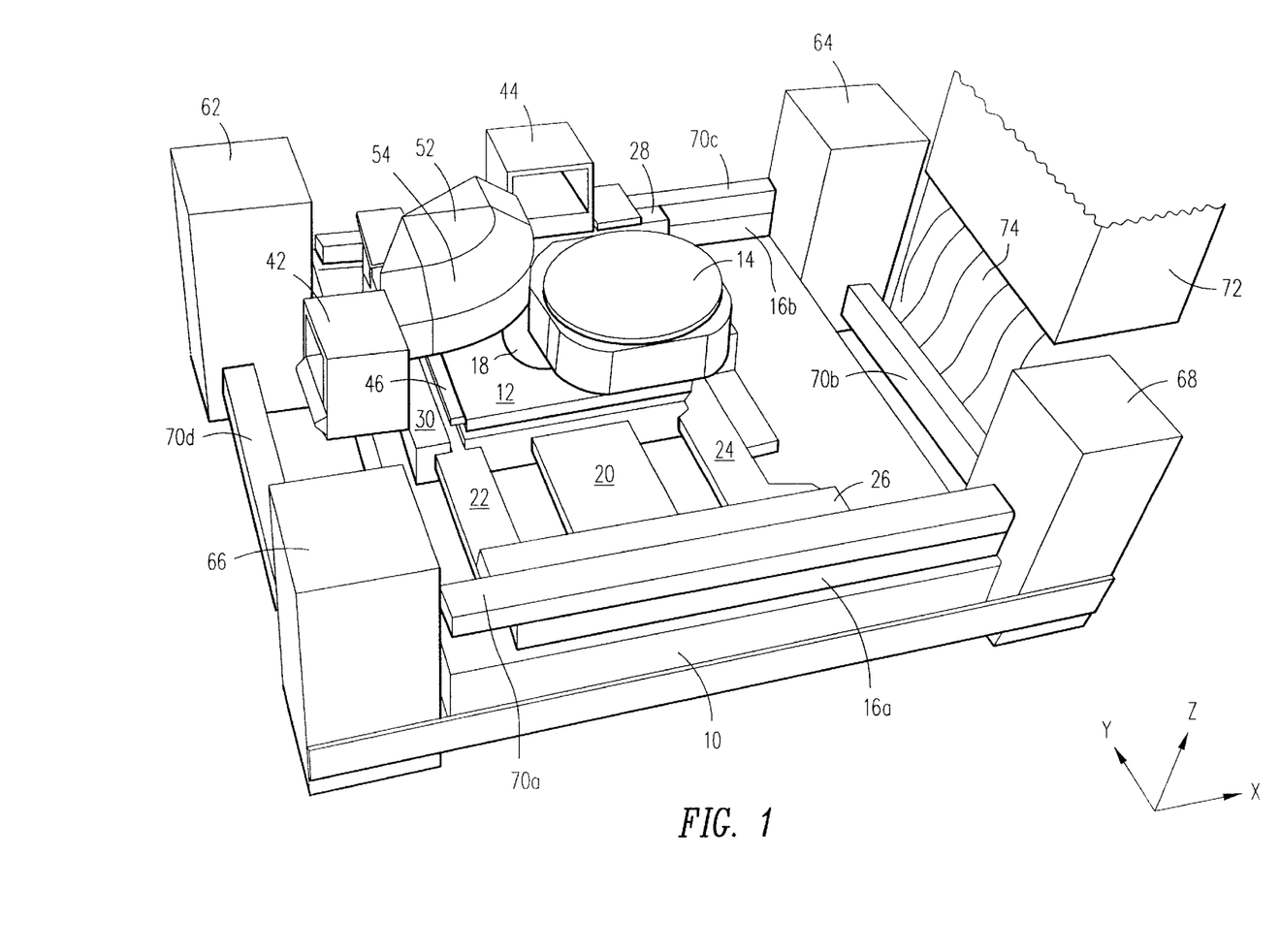
FIG. 1 shows a perspective view of part of the interior of an environmental chamber including a wafer stage, interferometer beam sources, and a local duct in accordance with the present invention.

FIG. 1 shows in perspective view a stage assembly and related structures in accordance with the present invention; most of these structures are conventional and of the type well known for use in photolithographic equipment, for either step and repeat or step and scan applications. The region shown is the wafer stage area in the lower part of an environmental chamber, which represents the principal area of application of the present invention; however the invention may be applied to the reticle stage area in the upper part of the chamber. The reticle stage area has air flow requirements similar in some ways to that of the wafer stage area. For example particulate control is even more important for the reticle than for the wafer, since a particle on the reticle could cause a defect on every chip in every wafer exposed with that reticle. Air temperature fluctuations are less of a problem, however for the reticle. First, many step and repeat optical lithography systems do not have an interferometrically controlled reticle stage, so air fluctuations are not relevant. Second, for those step and repeat systems, or step and scan systems, which do have an interferometrically controlled reticle stage, air temperature fluctuations are typically less serious than those close to the wafer stage. The reason is that the reduction projection lens typically reduces the image of the reticle on the wafer by a factor of 4 or 5. Consequently the effect at the wafer of any motion of the reticle stage caused by local air temperature fluctuations will also be reduced by a factor of 4 or 5. Therefore, the embodiment described here is for the wafer stage area.

Shown in FIG. 1 is a conventional base 10 (e.g. a large granite structure) on which a stage 12 moves. There are many known ways for the stage 12 to move on base 10 and to be supported thereon, and this is not essential to the present invention. Hence the present description of this stage is only for purposes of illustration, and the exemplary stage system described hereinafter is disclosed in U.S. patent application Ser. No. 08/325,740, filed Oct. 19, 1994, entitled "Precision Motion Stage with Single Guide Beam and Follower Stage," now U.S. Pat. No. 5,623,853 issued Apr. 29, 1997, incorporated herein by this reference. This is a stage intended to support e.g. a 200 mm. (8 inch) diameter wafer.

Figure 2:
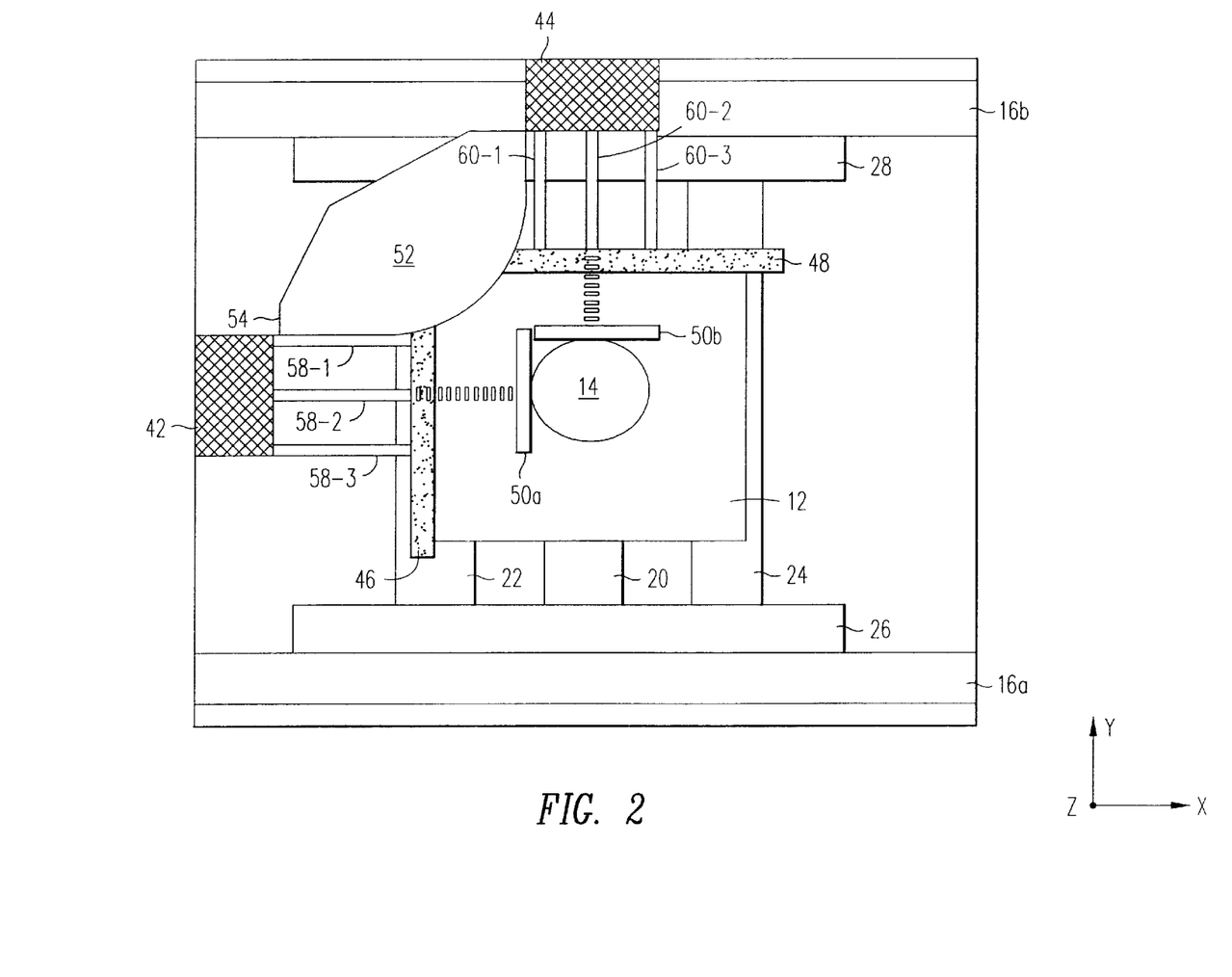
FIG. 2 shows a simplified top view of the chamber of FIG. 1.
Figure 3:
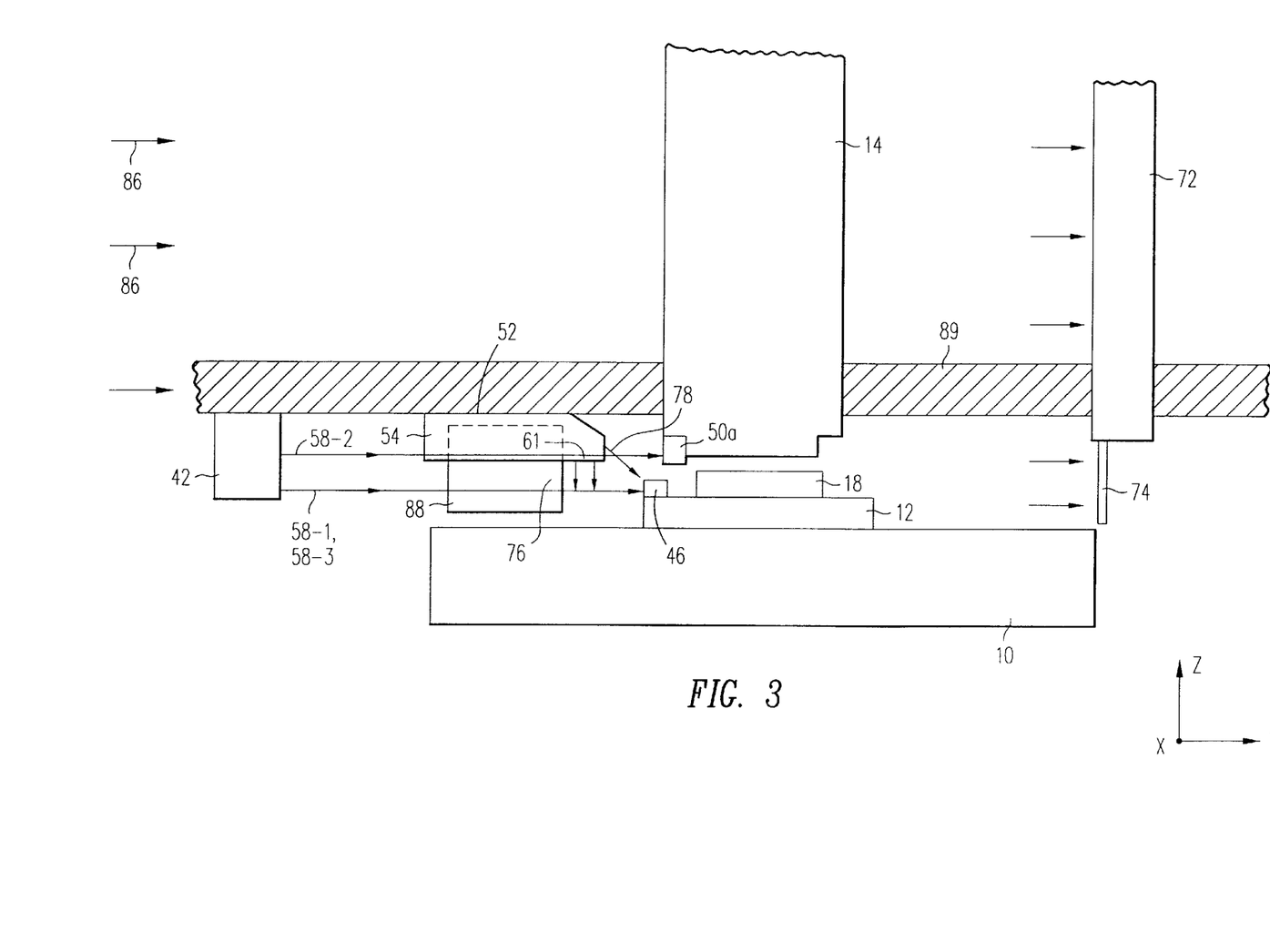
FIG. 3 shows a simplified side view of the chamber of FIG. 2.

Wafer stage 12 moves in the y direction (see axes at lower right of FIG. 1) guided by movable scan guide bar 20; stage 12 is supported by air bearings (not shown) and driven in the y direction by linear motors including magnetic tracks 22 and 24. (Note that the XYZ axes indicated in FIGS. 1, 2 and 3, are not part of a structure but merely for reference purposes.) The stage 12 with its scan guide bar 20 and linear motors is moved in the x direction by means of air bearings (not shown) and linear motor coils 26 and 28 moving along magnetic tracks 16a, 16b mounted on base 10. A heat baffle 30 removes heat from the linear motor 22, to avoid heating the air near the x interferometer beams. Wafer chuck 18 is mounted on stage 12.

Mounted on stage 12 are conventional perpendicularly-arranged interferometry mirrors 46 and 48 (not seen here). Mirror 46 is oriented to reflect a light beam (or beams) incident from interferometer source mount 42. Mirror 48 is located to reflect an interferometer beam (or beams) incident from an interferometer source mount 44. It is to be understood that in most cases the actual laser which provides the interferometer beams is not located in mount 42 or in mount 44. Instead these are housings for interferometer optical elements which receive laser beams incident from a single laser located away from the area of the stages and interferometer, in order to minimize the effect of heat from the laser source on the air temperature stability.

Pillars 62, 64, 66, 68 support the reticle stage (not shown) and the upper part of the projection lens, of which only the lower part 14 is shown here. The pillars are braced by members 70a, 70b, 70c, 70d.

As explained in further detail below, in the prior art and in accordance with the invention, the main air circulation in the chamber flows e.g. from the left hand side of FIG. 1 towards the right hand side of FIG. 1. This air circulation is typically provided from a source of air, and the air is then passed through a large HEPA filter and then circulates across the structures of FIG. 1 and then part of the air exits through air return duct 72. Most of the air exits at vents 74 which in one embodiment are flexible plastic strips allowing the air to vent between them; it is to be understood that a positive pressure is maintained inside the chamber.

A novel structure shown in FIG. 1 is the local air duct 54 having a top surface 52 and supplied by air via two inlets (not shown). The air (from a conventional temperature controlled external source) enters each of the inlets and is communicated to the interior of local air duct 54, there to be distributed as described hereinafter.

As can be seen in FIG. 2 which is a top view of some of the structures of FIG. 1, the local duct 54 has an overall approximate quadrant (quarter circle) shape. The purpose is to provide a uniform flow of air which is azimuthally symmetric in the XY plane, thus providing a uniform air flow across the laser beams 58-1, 58-2, 58-3, 60-1, 60-2, 60-3 emanating from the X interferometer mount 42 and the Y interferometer mount 44. This flow is advantageously provided from the single local air duct 54 rather than two separate ducts. At its further travel, the nearest edge of stage 12 is about 20 cm from local duct 54. For the x-axis beam, beam 58-1 is the "windward" beam, and beam 58-3 is the "leeward" beam incident on mirror 46. Beam 58-2 is shown incident on reference mirror 50a mounted on lens 14. For the Y direction interferometer beams, the "windward" beam 60-1 and "leeward" beam 60-3 are incident on stage mirror 48, and beam 60-2 is incident on the second reference mirror 50b mounted on lens 14. However, this illustration does not show all the beams; there are three beams incident on each of mirrors 46, 48, 50a and 50b, for a total of twelve beams, only some of which are illustrated for clarity. The beams incident on lens mirrors 50a, 50b are conventionally used to correct for small mechanical instability in the lens 14 location. The air flow from local duct 54 also traverses beams 58-2 and 60-2, since the vertical spacing between beams 58-2 and 60-2 and the other beams is only about 20 mm.

FIG. 3 is a simplified side view of the structures of FIG. 2. FIG. 3 shows the main chamber air flow 86 (entering through a HEPA filter, not shown) passing over the stage 12 and exiting at the air return duct 72 and vents 74. Thus the arrows of FIG. 3 illustrate various air flows including the main chamber flow 86, the outward flow 78 from local duct 54, and the downward flow 76 from a downflow duct 61 on the underside of local duct 54. The air flow 78 from the local air duct 54 is provided at an angle of e.g. 25° from the horizontal (the plane of the interferometer beams). Typically the velocity of the air flow 86 is 0.3 meter per second, while the air flow from the local air duct 54 is at 0.5 meter per second velocity (but of much less air volume than the main air flow). Also in accordance with the invention a lower rear airflow is provided into the chamber from duct 88 as explained further below.

FIG. 3 shows support plate 89 which is a large e.g. metal plate through which the lower portions of lens 14 and air return duct 72 protrude. Plate 89 is attached to columns 62, 64, 66, and 68 of FIG. 1 (and not shown in FIG. 3 for simplicity). Mount 42 and local duct 54 are supported by plate 89, which at least partially isolates the lower part of the chamber near stage 12 from the upper part of the chamber including the reticle stage (not shown).

As can be understood from FIG. 3, if the stage 12 happens to be located directly underneath the local duct 54, it will not receive the air flow 86 which is blocked by local duct 54, and moreover the relatively small clearance between the lower surface of local duct 54 and a wafer on chuck 18 would prevent proper flow of air thereover. Downflow duct 61 is in effect therefore a second nozzle which provides a downflow of air; this downflow thereby passes over the stage 12 when the stage 12 is located underneath the local duct 54 and hence would not receive adequate air flow 86. The downflow duct 61 thus operates whenever the local duct 54 is in operation.

The lower rear auxiliary air flow as depicted in FIG. 3 in accordance with the present invention is from an additional duct 88 which blows air around the local duct 54. Duct 88 is mounted on the wall of the chamber nearest interferometer mount 44, is not visible in FIG. 1, and is partly hidden from view by local duct 54 in FIG. 3. Air flow from duct 88 reduces turbulence in the area of the Y interferometer beams. Air flow from duct 88 is e.g. at 0.3 meter per second and an exemplary size for duct 88 is 20 cm high by 10 cm wide. Duct 88 in one version has its own air supply, HEPA filter, and temperature control.

It is to be emphasized that FIGS. 1 to 3 depict only schematically the location of and air flows from the local duct and do not depict any operational details or structure thereof. As will be understood, a variety of configurations are available for local duct 54 to provide the desired air flows. The following description is one example of a local duct 54.

Figure 4:
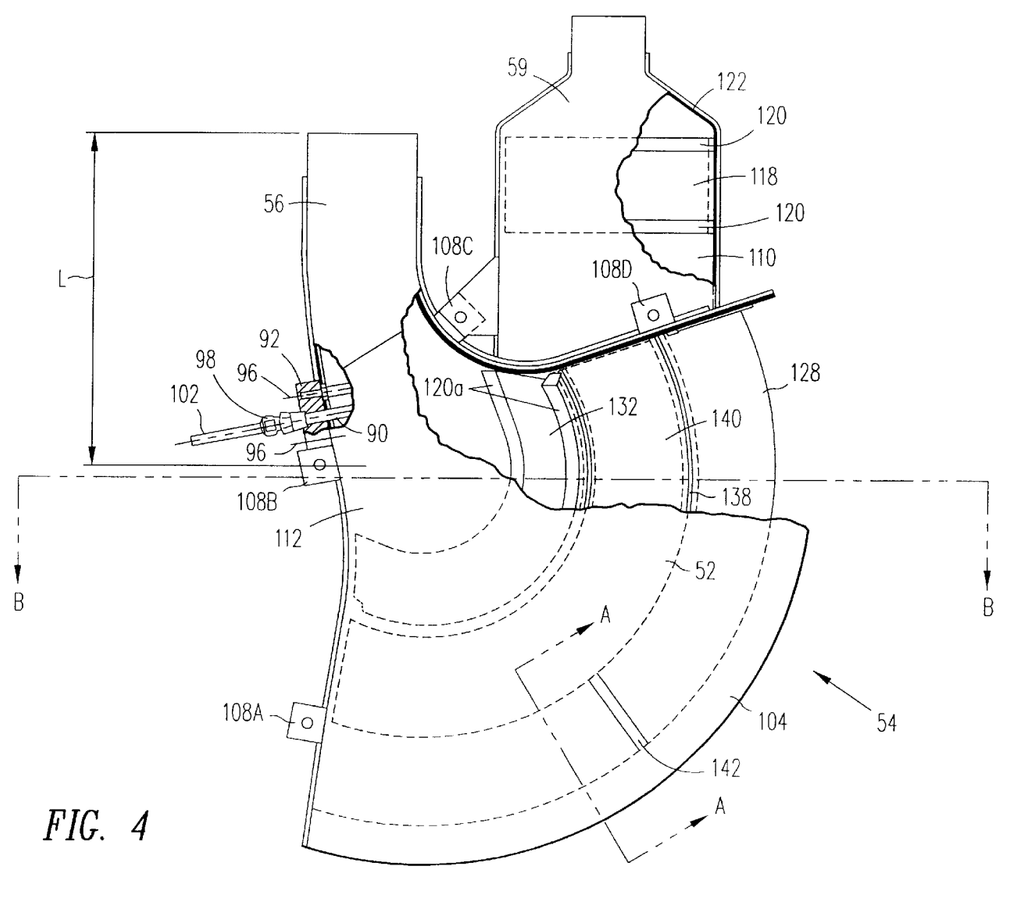
FIG. 4 shows a detailed top view of a local air duct in accordance with the present invention.

FIG. 4 shows a top view (corresponding to that for example of FIG. 2) of local duct 54. Dimension L in FIG. 4 is approximately 24 centimeters in one version and the overall length of the structure shown in FIG. 4 is approximately 60 centimeters. (These dimensions are for an exemplary photolithographic machine as described above that accommodates a wafer size of 200 millimeter diameter.)

The local duct structure of FIG. 4 is fabricated from e.g. thermally insulated sheet metal (stainless steel) or conductive plastic. The illustrated version is from plastic, and as will be understood by one skilled in the art, certain of the construction details are a result of the material.

As shown in FIG. 4, the two air inlets 56 and 59 are parallel to one another. As can be seen, FIG. 4 is a partial cutaway view showing internal passages (plenums) 110 and 112 communicating respectively with inlets 58, 56. To the left side of local air duct 54 in FIG. 4 is a temperature sensor assembly including temperature probe 90 held in mounting 92 and which connects via fastener 98 to an external electrical lead 102. Mounting 92 is held in the local duct 54 shell by screw 96.

Tabs 108A, 108B, 108C, and 108D are mounting structures which are attached (e.g. by bolts or machine screws) to convenient locations (e.g. to plate 89 of FIG. 3) in the chamber of the photolithography machine. Of course, other mounting structures may be used. A HEPA filter 118 is located in inlet passage 59, and secured by a perimeter gasket 120. Layer 122 shows a strengthening joint of two overlapping pieces of the local duct plastic shell. A second gasket 120a is located at the edges of heat exchanger 132, described further below. Gasket 138 is located at the edges of the local air duct main HEPA filter 140. A vane (baffle) 142 (see also FIG. 6B) is located in the nozzle opening 104.

Figure 5:
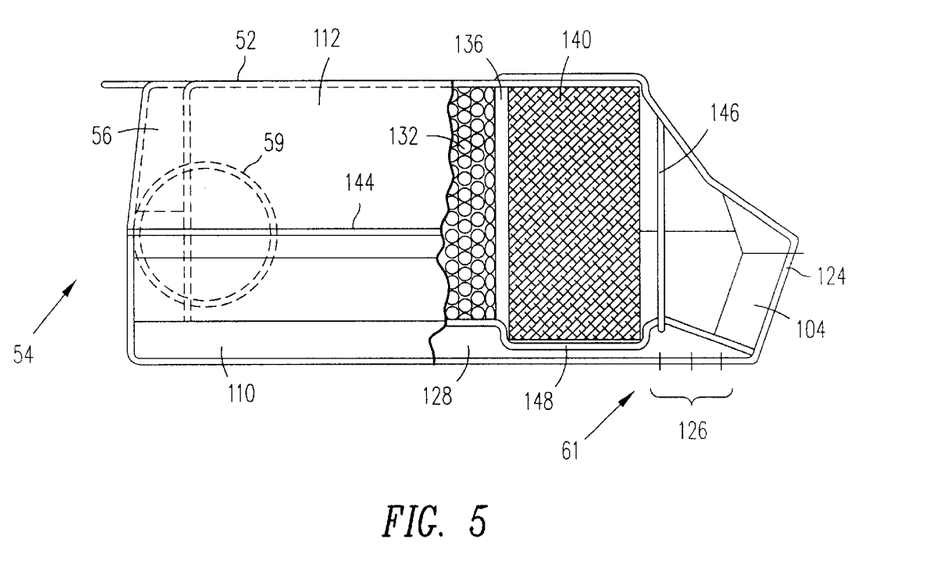
FIG. 5 shows a cross-sectional side view of the structure of FIG. 4.

FIG. 5 is a cross-sectional side view taken along line B—B of FIG. 4. The structures shown in FIG. 5 are mostly the same as those shown in FIG. 4. The downflow duct 61, which is a portion of the lower surface of the local duct structure, includes outflow holes 126 which are in communication with plenum 128. As better illustrated in FIG. 6B which is an external side view of local duct 54, the local air duct 54 terminates in perimeter nozzle 104. The opening of nozzle 104 is maintained in one embodiment by structural members 124 (better depicted in FIG. 6B). The entire opening of the nozzle 104 reflects the azimuthal symmetry of the local duct, helping to provide a source of azimuthally symmetric laminar airflow.

Figure 6A:
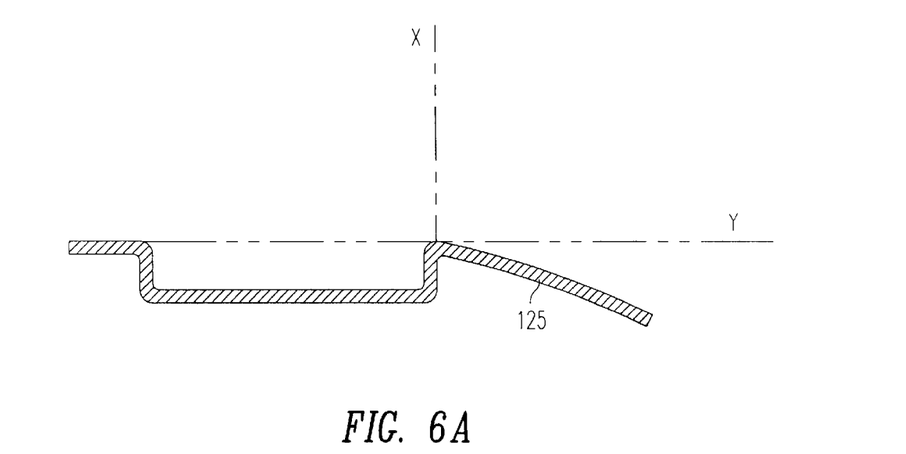
FIG. 6A shows a detail of the structure of FIG. 4.
Figure 6B:
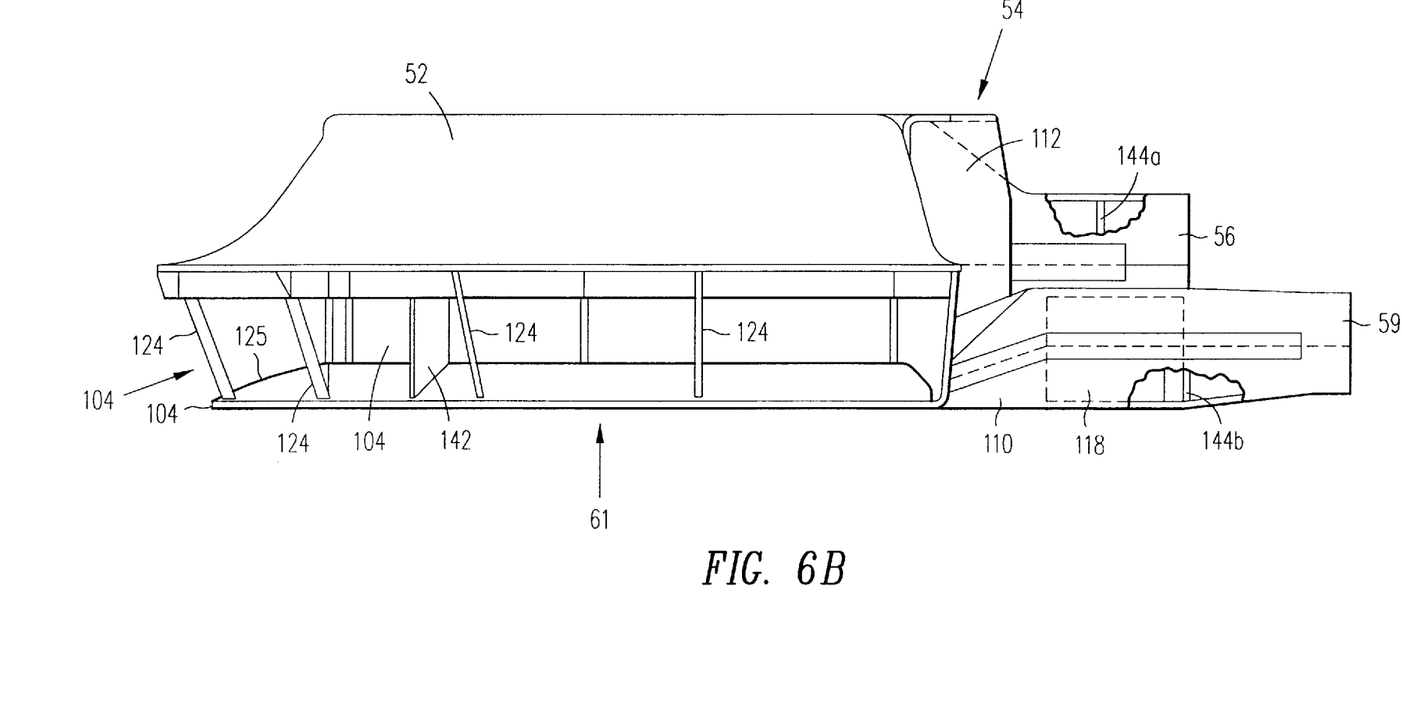
FIG. 6B shows a cross-sectional side view of the structure of FIG. 4.

FIG. 6A shows detail of the lower lip 125 of nozzle opening 104, also depicted in FIG. 6B. FIG. 6A is the cross-section of lip 125 along line A—A of FIG. 4. This lower lip 125 in one embodiment has the structure defined by the following table, where X and Y are dimensions in inches along the X and Y axes shown in FIG. 6A. The shape of the lip 125 is the primary determinant of the air flow direction from the nozzle 104.

| COORDINATES, LIP SECTION A-A | | | |
|---|---|---|---|
| X + 0.00 | Y − 0.030 | X + 1.15 | Y − .354 |
| X + 0.05 | Y − 0.038 | X + 1.20 | Y − .373 |
| X + 0.10 | Y − 0.046 | X + 1.25 | Y − .391 |
| X + 0.15 | Y − 0.055 | X + 1.30 | Y − .410 |
| X + 0.20 | Y − 0.065 | X + 1.35 | Y − .429 |
| X + 0.25 | Y − 0.076 | X + 1.40 | Y − .448 |
| X + 0.30 | Y − 0.087 | X + 1.45 | Y − .467 |
| X + 0.35 | Y − 0.099 | X + 1.50 | Y − .486 |
| X + 0.40 | Y − 0.112 | X + 1.55 | Y − .505 |
| X + 0.45 | Y − 0.125 | X + 1.60 | Y − .524 |
| X + 0.50 | Y − 0.138 | X + 1.65 | Y − .543 |
| X + 0.55 | Y − 0.153 | X + 1.70 | Y − .562 |
| X + 0.60 | Y − 0.167 | X + 1.75 | Y − .581 |
| X + 0.65 | Y − 0.182 | X + 1.80 | Y − .599 |
| X + 0.70 | Y − 0.198 | X + 1.85 | Y − .618 |
| X + 0.75 | Y − 0.214 | X + 1.90 | Y − .636 |
| X + 0.80 | Y − 0.230 | X + 1.95 | Y − .654 |
| X + 0.85 | Y − 0.247 | X + 2.00 | Y − .674 |
| X + 0.90 | Y − 0.264 | X + 2.05 | Y − .697 |
| X + 0.95 | Y − 0.282 | X + 2.10 | Y − .724 |
| X + 1.00 | Y − 0.299 | X + 2.15 | Y − .754 |
| X + 1.05 | Y − 0.317 | X + 2.195 | Y − .787 |
| X + 1.10 | Y − 0.336 | | |

FIG. 6B is an external and a partial cutaway view along line B—B of FIG. 4 showing the internal structure of the air inlets 56 and 59. Structures 144a, 144b in FIG. 6B are fasteners to hold together the plastic outer shell of local duct 54.

In this embodiment several other structures are located in the interior of local duct 54. These include a heat exchanger (i.e. a thermal reservoir) 132 (shown partially cut away by its uneven left edge in FIG. 5) which is e.g. a porous (open cell) aluminum sponge material to better maintain temperature uniformity. The heat exchanger thereby smooths out over time any fluctuations in the temperature of the air passing through it. An air void 136 separates heat exchanger 132 from the HEPA filter 140 which extends along the full length (perimeter) of the quadrant to filter the air leaving the heat exchanger 132 and to provide a uniform pressure at the inlet of the nozzle 104.

The frame 148 for HEPA filter 140 is somewhat recessed, as shown, so as to insure proper air flow over the lower lip 125 of the nozzle 104. However enough space is left below frame 148 so as to not impede air flow through plenum 128 from plenum 110. Such HEPA filters are well known and commercially available, as is suitable aluminum sponge material. The porous aluminum sponge used here has a hole density of approximately 10 pores per linear inch, and a density approximately 7% that of solid aluminum; it is available from ERG Inc. of Oakland, Calif. Its properties ensure that the pressure drop (which is very low) across the heat exchanger 132 is constant over the downstream face of the heat exchanger. Seam 144 is a joint in the local duct 54 shell; member 146 is a support to maintain the shape of the local duct 54.

Both heat exchanger 132 and HEPA filter 140 have the same azimuthal symmetry as the nozzle 104, again to help assure azimuthally symmetric laminar flow from the nozzle 104.

FIG. 5 shows that the cross sectional shape of the plenum 128 immediately above the holes 126 is wedge shaped, i.e. thinner near the perimeter of the structure than towards the center of the structure. This has been found to produce the most uniform flow through the holes 126. However the air flow from the holes 126 is generally a turbulent (nonlaminar) flow.

In addition to filtering the air of particulates, the HEPA filter 140, as well as the heat exchanger 132, help equalize air pressure over the outlet face of the HEPA filter 140. This has been found to be an important condition for producing a flow of air from the nozzle 104 which is as azimuthally symmetric as possible. It is to be understood that the HEPA filter 140 and heat exchanger 132 may take other forms, i.e. be other shapes of filters or other types of heat exchangers. The total length of the nozzle 104 along its perimeter in one embodiment is approximately 63 centimeters, covering an azimuthal angle of 134°. Nozzle 104 has a typical contraction ratio of approximately 1.0. (The contraction ratio is the ratio of the nozzle 104 inlet area to the outlet area.) The spacers 124 (better shown in FIG. 6) are mechanical supports to maintain a proper spacing, i.e. opening height, of nozzle 104 and may be dispensed with in other embodiments, depending upon the material and structural characteristics of the local duct 54. In fact, it has been found it is preferable to omit these spacers because to a certain extent they interfere with the uniform output of air.

In another embodiment the height of nozzle 104 is mechanically adjustable. For instance the shell of local air duct 54 (typically thin plastic or sheet metal) may be slightly deformed by a mechanical adjustment mechanism (not shown) to alter the nozzle shape. This adjustment can be either to redirect the air flow from the nozzle 104 in terms of direction (to direct it relative to the interferometer beams) and/or to open and close the nozzle 104 so as to maintain a uniform height across its entire length. In terms of the local duct material, the sheet metal version, i.e. stainless steel, may produce fewer undesirable particles. Typically the plastic version is electrically conductive plastic or has an electrically conductive coating to eliminate electrostatic charging which would undesirably attract and collect particles.

It has been found that the air outflow from the nozzle 104 may not be azimuthally uniform, and the structure of the nozzle 104 causes local eddies within the nozzle 104, i.e. local air flow stagnation regions. This is reduced by providing at least one vane 142 (baffle) internal to nozzle 104 to break up these eddies and redirect the air flow into a more radial direction. Such a vane 142 as depicted in FIG. 6B is thin in cross section and perpendicular to the edge of nozzle 104. While only a single vane in nozzle 104 has been found to be adequate, alternatively a number of such vanes may be provided.

As depicted in FIG. 3, the local air duct 54 is mounted to be away from the lens column 14 and above the plane of the interferometer beams. In one version (not shown), the local air duct outflow is in the plane of the interferometer beams to provide optimum air flow. In this case the local air duct flow 78 is not at the downwards angle depicted in FIG. 3 but is horizontal. However, typically this location of local air duct 54 interferes with the movement of the stage 14.

Figure 7:
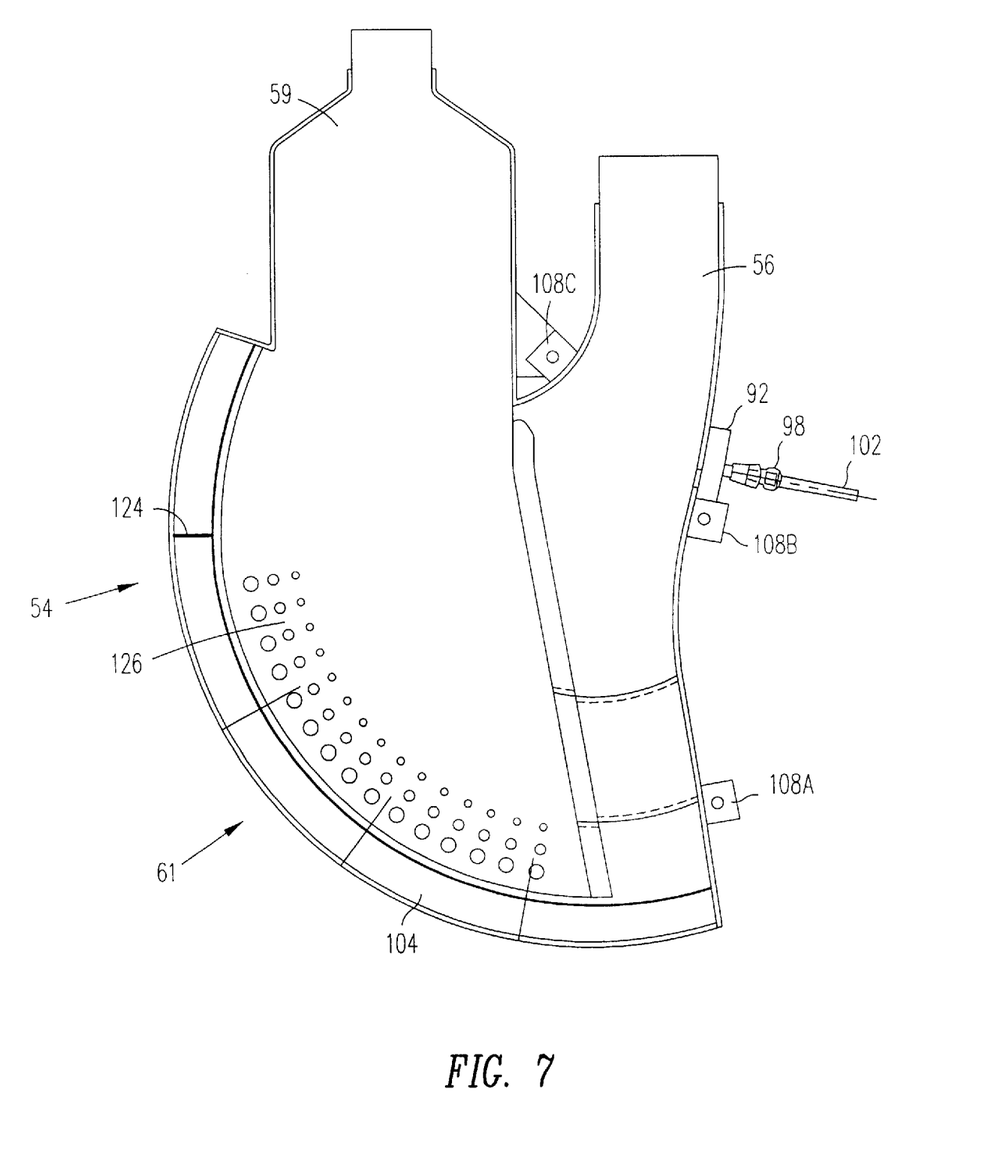
FIG. 7 shows a bottom view of the structure of FIG. 4.

FIG. 7 shows a view of the underside of the structure of FIG. 4, i.e. a bottom view of the local air duct 54, which is the portion of the local duct 54 which faces the base 10 and stage 12 in FIG. 1. The downflow duct 61 here is an array of holes 126 in FIGS. 5 and 7. The downflow duct holes 126 are in this version arranged radially, and the outer set of holes i.e. those nearest the perimeter of local air duct 54, are larger in diameter than those farther from the perimeter. This hole arrangement has been found to provide uniform air flow since typically the internal air pressure is highest away from the perimeter of local air duct 104.

The arrangement of the plenums as shown in FIGS. 4 to 6B is such that the downflow duct and its plenum act as an insulator between the main air flow passing into inlet 59 and out the nozzle 104, and the surrounding air in the chamber. This is because the air passing out through the downflow duct 61 is at the outer portion of the local air duct 54 structure and is at the same temperature as the air flowing inside the main plenum of the local duct 54.

The local air duct structure depicted herein has been found to maintain an air temperature fluctuation at the nozzle 104 of ±0.002° C., using a feedback thermostatic control with the temperature sensor 90 in combination with the thermal insulation provided by the local duct structure itself and the heat exchanger 132.

Other dimensions (these are merely illustrative) are that the total height of the local air duct 54 structure is approximately 8.2 cm, the radius of curvature of the nozzle 104 is 254 cm, and the height of nozzle 104 is 5.8 cm.

Figure 8A:
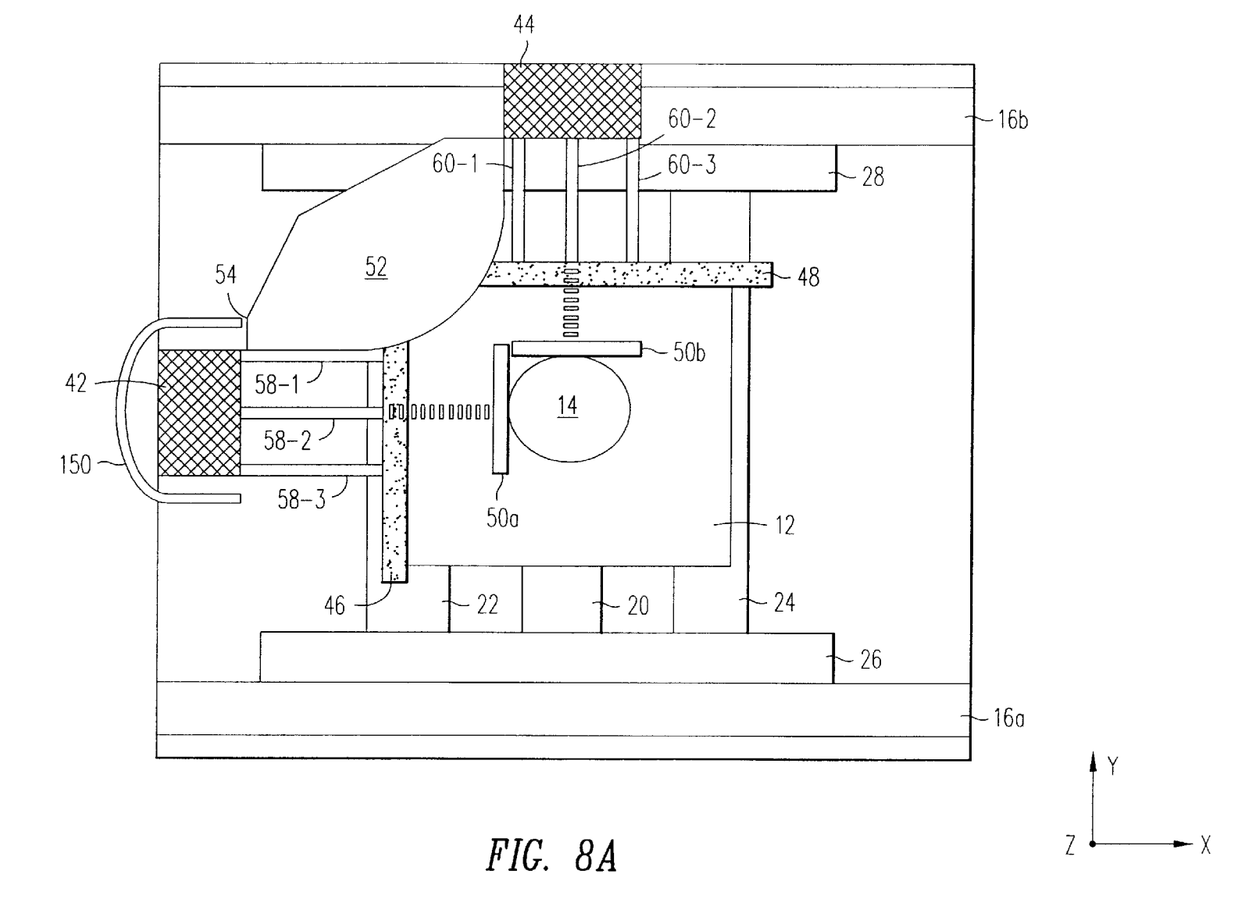
FIG. 8A shows a top view of a chamber with an interferometer beam shield in accordance with the present invention.

FIG. 8A depicts another feature in accordance with the present invention. The view and structures of FIG. 8A are identical to those of FIG. 2, with the addition of interferometer mount shield 150. As shown, this is an air flow shield (baffle) located between the main chamber air flow 86 and the interferometer mount 42.

Shield 150 thereby baffles the X-direction interferometer beams emanating from mount 42 from air turbulence caused by main chamber air flow 86. The shield 150 is shown in this top view as being a simple curved structure extending beyond the width of the interferometer mount 42 so as to shield all of the beams emanating therefrom.

Hence in this embodiment the height of shield 150 (in the Z axis direction) is sufficient to completely shield the interferometer mount 42 from the impinging air flow 86. Preferably shield 150 is mounted independent of the interferometer mount 42 to prevent any air impinging on shield 150 from disturbing the interferometer beams. For instance, shield 150 may be suspended from above, i.e. from the top plate of the chamber (not shown). The shield 150 is typically of sheet metal or conductive plastic.

Figure 8B:
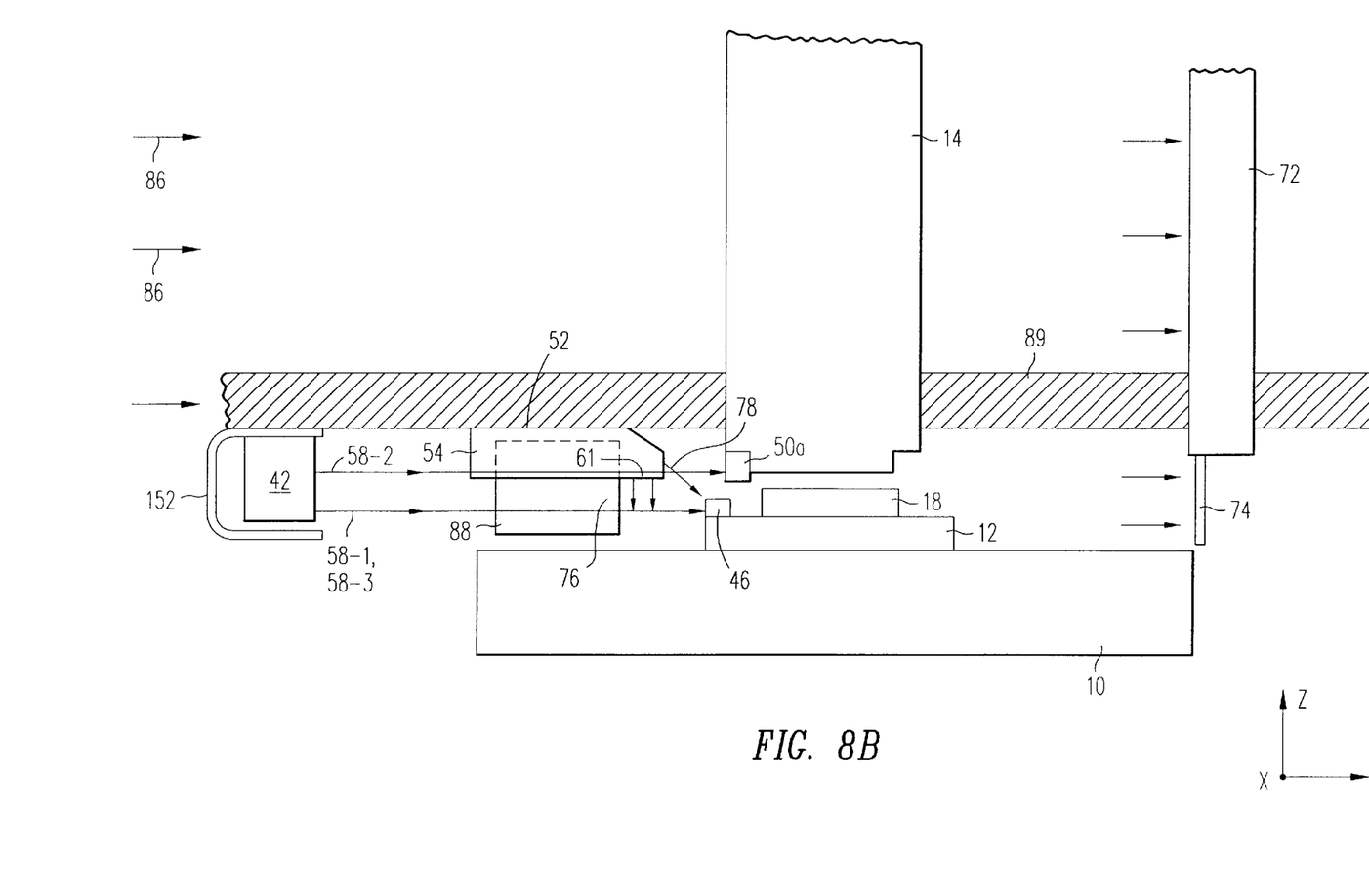
FIG. 8B shows a side view of a chamber with a second type of interferometer beam shield in accordance with the present invention.

Alternatively as shown in FIG. 8B, a shield 152 is curved around interferometer mount 42 in the horizontal plane, and serves the same purpose as shield 150. FIG. 8B is similar to FIG. 3, with the addition of shield 152. Alternatively the shield may be curved, and enclose the interferometer mount 42, in both the horizontal and vertical planes (not shown).

This disclosure is illustrative and not limiting. Further modifications will be apparent to one skilled in the art in the light of this disclosure and are intended to fall within the scope of the appended claims.

We claim:

1. An air circulation system for use with a location apparatus in an enclosure with a movable object located therein, the location apparatus including two mirrors mounted on the movable object at an angle to one another, and having two sources of light beams inside the enclosure, the two sources being spaced apart and each directing at least one light beam onto each one of the mirrors, the circulation system comprising:

a first source of air directed through the enclosure and across the movable object; and a second source of air directed towards the object at least when the object is in a central location in the enclosure, the second source of air directing the air from a single outlet across each of the light beams.

2. The system of claim 1, wherein the second source of air includes a nozzle having a curved shape.

3. The system of claim 2, wherein the curved shape defines a circular sector having a span of approximately a quarter of a circle.

4. The system of claim 1, wherein the air from the second source is directed at an angle of about 25° from a plane defined by the at least one light beam from each of the two sources of light beams.

5. The system of claim 1, wherein air from the second source flows azimuthally symmetrically about a vertical axis across each of the at least one light beam from each of the two sources of light beams.

6. The system of claim 2, further comprising at least one adjustable member coupled to the nozzle to vary the shape of the nozzle within a range of predetermined azimuthal directions.

7. The system of claim 2, further comprising a plurality of spacer members extending across the nozzle.

8. The system of claim 2, further comprising at least one baffle disposed in the nozzle.

9. The system of claim 1, wherein the second source of air is a duct having an air filter disposed therein.

10. The system of claim 9, wherein the duct includes a frame formed therein, the air filter being disposed in the frame.

11. The system of claim 10, wherein the frame comprises a recess formed in an inner peripheral surface of the duct.

12. The system of claim 9, further comprising a thermal reservoir structure located inside the duct.

13. The system of claim 12, wherein the thermal reservoir structure is a porous metal material.

14. The system of claim 2, wherein the nozzle has a contraction ratio of at least 0.9.

15. The system of claim 2, wherein the nozzle is located above a plane defined by the at least one light beam from each of the two sources of light beams.

16. The system of claim 2, wherein the nozzle is spaced apart from a central portion of the enclosure.

17. The system of claim 1, further comprising a shield interposed between the first source of air and at least one of the light beam sources.

18. The system of claim 17, wherein at least one light beam source includes a mount holding an optical element, the shield curving around the mount.

19. The system of claim 2, wherein the second source of air is a duct, the nozzle including an opening at the extremity of the duct, further including a plurality of holes defined by the duct to direct a third flow of air onto the movable object when the movable object is located under the duct.

20. The system of claim 19, wherein the plurality of holes are disposed along at least one curve in the duct, the at least one curve being shaped in accordance with a perimeter surface of the nozzle.

21. The system of claim 20, wherein the plurality of holes have diameters determined in accordance with a relative distance from the nozzle.

22. The system of claim 19, further comprising at least one partition inside the duct defining a first plenum in communication with the nozzle and a second plenum in communication with the plurality of holes.

23. The system of claim 22, further comprising a first air supply passage in communication with the first plenum and a second air supply passage in communication with the second plenum.

24. The system of claim 22, wherein the second plenum is located in a portion of the duct closer to the light beams than is in the first plenum.

25. The system of claim 22, wherein the second plenum is tapered in cross section immediately adjacent the nozzle.

26. The system of claim 23, wherein the first and second air supply passages are parallel to one another.

27. The system of claim 1, further comprising a third source of air into the enclosure, the third source admitting air into the enclosure at an angle of about 90° to a direction of the first source of air.

28. The system of claim 1, further comprising means for controlling a temperature of the second source of air.

29. The system of claim 1, wherein the movable object is a stage.

30. The system of claim 22, further comprising a filter located in the first plenum.

31. A method for circulating air in an enclosure, wherein a movable object in the enclosure includes two mirrors mounted on the movable object at predetermined orientations relative to the movable object, a position of the movable object being determined interferometrically by directing at least one light beam onto each mirror, the method comprising the steps of:

directing a first flow of air from a first source through the enclosure and across the movable object; and directing a second flow of air from a second source spaced apart from the first source, the second flow of air being directed from a single outlet across each of the light beams at least when the movable object is in a central location in the enclosure.

32. A lithography apparatus for imaging a pattern onto a substrate supported on a two-dimensional movable stage, the apparatus comprising:

(a) a first interferometer for projecting a first beam toward a first reflective portion on the stage along a first direction, thereby to measure a position or movement of the stage in the first direction;

(b) a second interferometer for projecting a second beam toward a second reflective portion on the stage along a second direction perpendicular to the first direction, thereby to measure a position or movement of the stage in the second direction; and (c) a duct disposed between optical paths of the first and second beams and about the stage, and having a single flow outlet for supplying a temperature controlled flow uniformly in a direction intersecting the optical path of the first beam, and a direction intersecting the optical path of the second beam.

33. An air circulation system for use with a location apparatus in an enclosure with a movable object located therein, the location apparatus including two mirrors mounted on the movable object at an angle to one another, and having two sources of light beams inside the enclosure, the two sources being spaced apart and each directing at least one light beam onto each one of the mirrors, the circulation system comprising:

a first source of air directed through the enclosure and across the movable object; and a second source of air directed towards the object at least when the object is in a central location in the enclosure, the second source of air directing the air across each of the light beams;

wherein the second source of air includes a nozzle having a curved shape which defines a circular sector having a span of approximately a quarter of a circle.

* * * * *